United States Patent
Renauld et al.

(10) Patent No.: US 9,583,341 B2
(45) Date of Patent: Feb. 28, 2017

(54) LAYER TRANSFERRING PROCESS

(71) Applicant: Soitec, Bernin (FR)

(72) Inventors: Vivien Renauld, La Pierre (FR); Monique Lecomte, Bivier (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/957,133

(22) Filed: Dec. 2, 2015

(65) Prior Publication Data
US 2016/0163535 A1    Jun. 9, 2016

(30) Foreign Application Priority Data
Dec. 4, 2014 (FR) ...................... 1402800

(51) Int. Cl.
*H01L 21/30* (2006.01)
*H01L 21/02* (2006.01)
*H01L 21/762* (2006.01)

(52) U.S. Cl.
CPC .... *H01L 21/0254* (2013.01); *H01L 21/02373* (2013.01); *H01L 21/02488* (2013.01); *H01L 21/02694* (2013.01); *H01L 21/76254* (2013.01)

(58) Field of Classification Search
CPC ........... H01L 21/02436; H01L 21/2007; H01L 21/2011; H01L 21/0234; H01L 21/0254; H01L 21/02694; H01L 21/76254
See application file for complete search history.

(56) References Cited

U.S. PATENT DOCUMENTS

| | | |
|---|---|---|
| 2004/0053477 A1 | 3/2004 | Ghyselen et al. |
| 2012/0034758 A1 | 2/2012 | Koezuka |

FOREIGN PATENT DOCUMENTS

| | | |
|---|---|---|
| EP | 898307 A1 | 2/1999 |
| EP | 843345 A2 | 3/2004 |
| FR | 2681472 A1 | 3/1993 |
| FR | 2860249 A1 | 4/2005 |
| FR | 2905801 A1 | 3/2008 |
| FR | 2930072 A1 | 10/2009 |
| FR | 2977075 A1 | 12/2012 |

(Continued)

OTHER PUBLICATIONS

French Search Report and Opinion for French Application No. 1402800 dated Sep. 29, 2015, 11 pages.

(Continued)

*Primary Examiner* — Reema Patel
*Assistant Examiner* — Syed Gheyas
(74) *Attorney, Agent, or Firm* — TraskBritt

(57) ABSTRACT

A process for transferring a useful layer to a receiver substrate includes providing a donor substrate comprising an intermediate layer, a carrier substrate, and a useful layer. The intermediate layer is free of species liable to degas during a subsequent heat treatment, and is configured to become soft at a temperature. The receiver substrate and the donor substrate are assembled. An additional layer is provided between the receiver substrate and the carrier substrate that comprises chemical species that are susceptible to diffuse into the intermediate layer during the subsequent heat treatment so as to form a weak zone. The heat treatment is carried out on the receiver substrate and the donor substrate at a second temperature higher than the first temperature.

17 Claims, 4 Drawing Sheets

(56) References Cited

FOREIGN PATENT DOCUMENTS

FR     WO 2012176030 A1 * 12/2012   ....... H01L 21/76254
WO         03103026 A1    12/2003

OTHER PUBLICATIONS

Huang et al., Mechanics of Relaxing SiGe Islands on a Viscous Glass, ACTA Mechanica Sinica, vol. 18, No. 5, Oct. 2002, pp. 441-456.

* cited by examiner

LAYER TRANSFERRING PROCESS

CROSS-REFERENCE TO RELATED APPLICATION

Pursuant to 35 U.S.C. §119(a), this application claims the benefit of the filing date of French Patent Application No. 1402800, which was filed Dec. 4, 2014, the entire contents of which are incorporated herein in their entirety by this reference.

TECHNICAL FIELD

The present invention relates to a process for transferring a useful layer to a receiver substrate.

BACKGROUND

One process for transferring a useful layer to a receiver substrate, known from the prior art and described in French Patent FR2860249, comprises the following steps:

a) providing a donor substrate comprising an intermediate layer located between a carrier substrate and a useful layer, the intermediate layer being suitable to become soft from a first temperature;

b) providing a receiver substrate;

c) assembling the receiver substrate and the donor substrate; and d) carrying out a heat treatment on the receiver substrate and the donor substrate after step c), the heat treatment being carried out at a second temperature higher than the first temperature.

The intermediate layer may be a layer comprising a vitreous material.

The intermediate layer generally comprises at least one of phosphosilicate glass (PSG) and borophosphosilicate glass (BPSG).

The intermediate layer is characterized by a first temperature, generally called its glass transition temperature, from which the intermediate layer becomes soft and is capable of plastically deforming.

In step d), carried out at a second temperature above the glass transition temperature, micro-bubbles or micro-cavities are formed in the intermediate layer.

The micro-bubbles and micro-cavities formed in step d) originate from chemical species present in the intermediate layer. The chemical species transform into gas in step d). Since the intermediate layer and the useful layer are sandwiched between the carrier substrate and the receiver substrate, the chemical species transformed into gas are then trapped in the intermediate layer.

Consequently, the chemical species transformed into gas coalesce via an Oswald ripening mechanism so that the intermediate layer becomes spongy, and thus forms a weak zone.

It is then enough to exert a force on the intermediate layer to separate the carrier substrate from the structure formed in the assembling step c), and thus transfer the useful layer to the receiver substrate.

However, this process is unsatisfactory.

Specifically, the donor substrate cannot undergo processing steps comprising a temperature increase liable to generate a weak zone in the intermediate layer before the assembly step c). This would have the consequence of degrading the useful layer before its transfer.

Such a thermal annealing step is especially carried out in order to relax a pre-existing stress in the useful layer by softening the intermediate layer. By way of example, the useful layer may be a layer of GaN.

One object of the invention is thus to provide a process allowing the integrity of the useful layer to be preserved.

BRIEF SUMMARY

The present disclosure aims to solve the aforementioned problem and provides a process for transferring a useful layer to a receiver substrate, the process comprising the following steps:

a) providing a donor substrate comprising an intermediate layer located between a carrier substrate and a useful layer, the intermediate layer being suitable to become soft from a first temperature;

b) providing a receiver substrate;

c) assembling the receiver substrate and the donor substrate so that the useful layer and the intermediate layer are sandwiched between the carrier substrate and the receiver substrate; and d) carrying out a heat treatment on the receiver substrate and the donor substrate after step c), the heat treatment being carried out at a second temperature higher than the first temperature, the process being noteworthy in that the intermediate layer is exempt of species liable to degas, and in that an additional layer is formed, the additional layer comprising chemical species that are suitable to diffuse into the intermediate layer in step d) and form therein a weak zone.

Thus, the intermediate layer being free from species liable to degas, the useful layer is not degraded in step a).

Moreover, the formation of a weak zone is still possible by the formation of the additional layer.

Furthermore, the present disclosure provides an alternative method for forming a weak layer to methods proposed in the prior art.

According to one embodiment, a detaching step e) is carried out following step d) along the weak zone so that the useful layer is transferred to the receiver substrate.

According to one embodiment, the additional layer is sandwiched between the intermediate layer and the carrier substrate.

According to one embodiment, the additional layer is placed on the free surface of the useful layer in step a).

According to one embodiment, the additional layer is formed on the receiver substrate.

According to one embodiment, the useful layer comprises a plurality of regions separated by trenches that extend right through the thickness of the useful layer.

This makes it easier for chemical species contained in the additional layer to diffuse toward the intermediate layer when the useful layer is sandwiched between the intermediate layer and the additional layer.

According to one embodiment, the intermediate layer comprises a glass.

According to one embodiment, the glass comprises at least one material chosen from: phosphosilicate glass and borophosphosilicate glass.

According to one embodiment, the chemical species contained in the additional layer comprise at least one of the elements chosen from: hydrogen, nitrogen, helium and argon.

According to one embodiment, the additional layer is hydrogen-containing silicon dioxide.

According to one embodiment, the carrier substrate comprises at least one of the materials chosen from: silicon, germanium, silicon carbide and sapphire.

According to one embodiment, the useful layer comprises at least one of the materials chosen from: GaN and $In_xGa_{1-x}N$.

According to one embodiment, the receiver substrate comprises at least one of the materials from: silicon, germanium, silicon carbide and sapphire.

BRIEF DESCRIPTION OF THE DRAWINGS

The present disclosure will be better understood in light of the following description of one particular and non-limiting embodiment of the disclosure, given with reference to the accompanying figures, in which.

DETAILED DESCRIPTION

For the various methods of implementation, the same references will be used for elements that are identical or that provide the same function, for the sake of simplification of the description.

In accordance with a step a), a donor substrate 10 may be provided.

Figure 1:
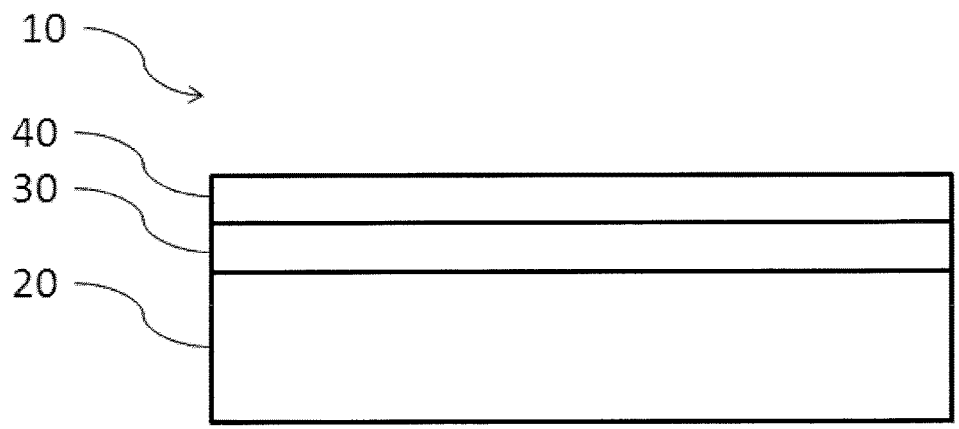
FIG. 1 is a schematic cross-sectional view of the donor substrate, according to one embodiment of the present disclosure.

The donor substrate 10, shown in FIG. 1, may comprise, from its back side to its front side, a carrier substrate 20, an intermediate layer 30 and a useful layer 40.

The carrier substrate 20 may comprise at least one of silicon, germanium, silicon carbide and sapphire.

The intermediate layer 30 is a layer that is configured to be plastically deformed when heated to a temperature at or above a first temperature.

The expression "plastic deformation" is understood to mean a permanent deformation or change in shape of a solid body without fracture, and includes what is referred to in the art as "creep," which is the tendency of a solid material to slowly plastically deform under the influence of mechanical stress.

The intermediate layer 30 may be a glass that possibly undergoes a glass transition at a first temperature that is also referred to as its "glass transition temperature."

The term "glass" is understood to mean a material that remains in the solid state at any temperature below a glass transition temperature, and the viscosity of which gradually decreases at temperatures above the glass transition temperature.

The intermediate layer 30 may comprise at least one of phosphosilicate glass (PSG) and borophosphosilicate glass (BPSG).

The first temperature may be in a range extending from 300° C. to 1000° C., and may be approximately 600° C., for example.

During fabrication of the donor substrate 10, the intermediate layer 30 may be formed on the carrier substrate 20 by plasma-enhanced chemical vapor deposition (PECVD).

For example, the intermediate layer 30 may comprise borophosphosilicate glass formed by a PECVD process involving, for example, the precursor tetraethylorthosilicate (TEOS). The deposition temperature of the PECVD process may be 400° C.

Thus, the thickness of the intermediate layer 30 may be in a range extending from 200 nm to 5 µm, and may be, for example, about 1 µm.

Moreover, the first temperature may be in a range extending from 300° C. to 1000° C.

Preferably, the intermediate layer 30 is exempt of species liable to degas after its formation. In other words, the intermediate layer 30 may not include chemical species susceptible to degassing during a heat treatment carried out at or above the first temperature.

However, during its formation, the intermediate layer 30 may contain species liable to degas.

Thus, during the fabrication of the donor substrate 10, the intermediate layer 30 may have undergone a densifying heat treatment comprising a temperature increase so as to densify the intermediate layer 30.

The heat treatment of the intermediate layer 30 is particularly advantageous when the intermediate layer 30 contains species liable to degas. This is especially the case for phosphosilicate or borophosphosilicate glasses.

The species liable to degas are typically subproducts resulting from the deposition reaction of the intermediate layer 30. The subproducts of the deposition reaction of the intermediate layer 30 may comprise alkyl groups and water.

Thus, after the densifying heat treatment has been carried out, the intermediate layer 30 does not include chemical species liable to degas. The intermediate layer 30 nevertheless preserves the capacity to plastically deform when it is heated to a temperature above the first temperature.

The densifying heat treatment may be carried out at a temperature in a range extending from 600° C. to 900° C. for a duration of 60 minutes to 300 minutes.

For an intermediate layer 30 comprising borophosphosilicate glass, the densifying treatment may be carried out at a temperature of 850° C. for a duration of 60 minutes under an oxygen and/or water-vapor atmosphere.

The useful layer 40 may be formed on the intermediate layer 30 by a transferring process. For example, the useful layer 40 may be formed by the SMART CUT® process. In this respect, the skilled person may refer to French Patent FR2681472.

During the process of transferring the useful layer 40, recourse is frequently made to a treatment comprising a temperature rise, for example, a step of consolidating a bonding interface such as that proposed in the aforementioned patent.

The absence of chemical species in the intermediate layer 30 liable to degas during such a step makes it possible to avoid degradation or deterioration of the useful layer 40.

The useful layer 40 may be a strained layer and, for example, may be a tensile-strained or compressive-strained layer. This is especially the case when the useful layer 40 comprises $In_xGa_{1-x}N$. Specifically, the alloy $In_xGa_{1-x}N$ is generally obtained by epitaxial growth on a GaN substrate, and is, therefore, strained. Thus, during the transfer of a layer comprising $In_xGa_{1-x}N$ to the intermediate layer 30 to form the useful layer 40, the strain in the $In_xGa_{1-x}N$ is preserved.

When the useful layer 40 is strained, the strain may be relaxed by carrying out a heat treatment at a temperature above the first temperature. The heat treatment allows the intermediate layer 30 to creep.

Since the intermediate layer 30 is free of species liable to degas, micro-bubbles or micro-cavities, such as those described in French Patent FR2860249, do not form. Consequently, there is no risk of degradation or deterioration of the useful layer 40 during the heat treatment at a temperature above the first temperature.

Figure 2A:
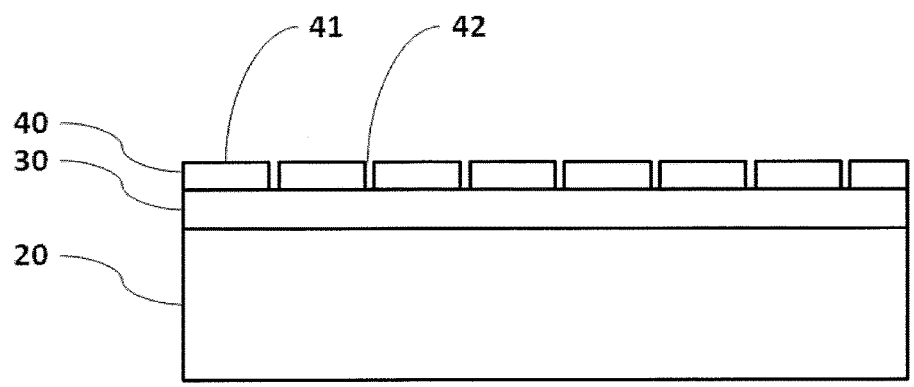
FIGS. 2a through 2c are schematic views of the donor substrate, according to one embodiment of the present disclosure.
Figure 2B:
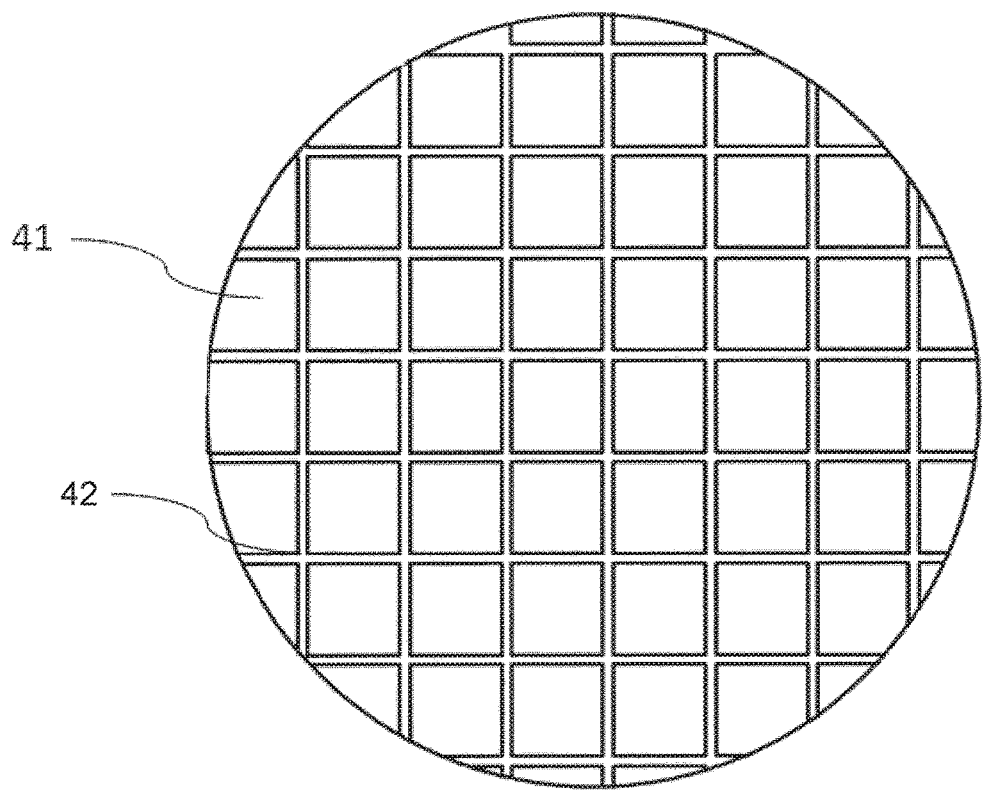

The useful layer 40 may comprise a plurality of regions 41 separated by trenches 42 that pass right through the thickness of the useful layer 40. The trenches 42 may be produced by etching the useful layer 40 using techniques known to those skilled in the art. FIGS. 2a and 2b show the plurality of regions 41 of the useful layer 40 in cross-section and from above, respectively. The regions 41 may be any shape and, for example, be squares of 100 µm to 2000 µm side length.

A step b) of a process according to the present disclosure may comprise providing a receiver substrate 50. The receiver substrate 50 may comprise at least one of the materials chosen from: silicon, germanium, silicon carbide and sapphire.

The transferring process also comprises forming an additional layer 60. The additional layer 60 may be disposed between the carrier substrate 20 and the receiver substrate 50 upon assembling the receiver substrate 50 and the donor substrate 10, as described herein.

The additional layer 60 comprises chemical species suitable to diffuse into the intermediate layer 30 during a heat treatment carried out at a second temperature above the first temperature. In other words, the additional layer 60 comprises chemical species susceptible to diffusion out from the additional layer 60 and into the intermediate layer 30 during a heat treatment carried out at or above the first temperature so as to form a weak zone in the intermediate layer 30.

Figure 3A:
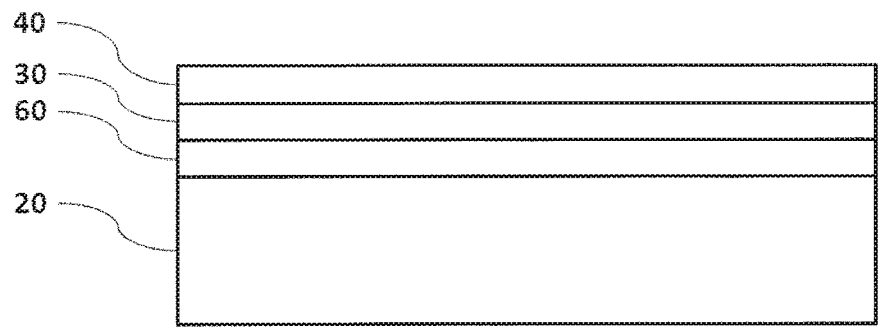
FIGS. 3a through 3d are schematic cross-sectional views, according to various embodiments of the present disclosure.
Figure 3B:
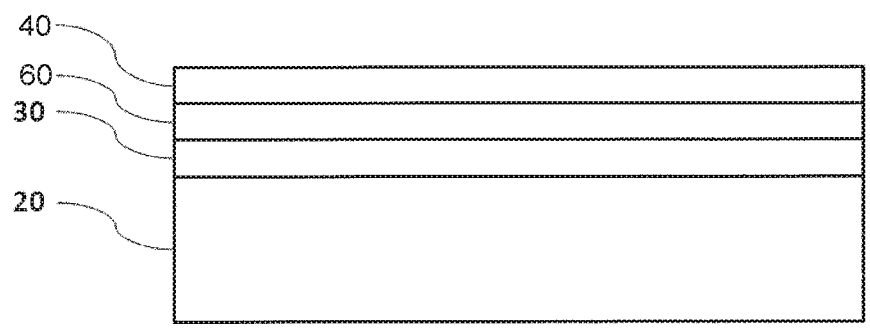
Figure 3C:
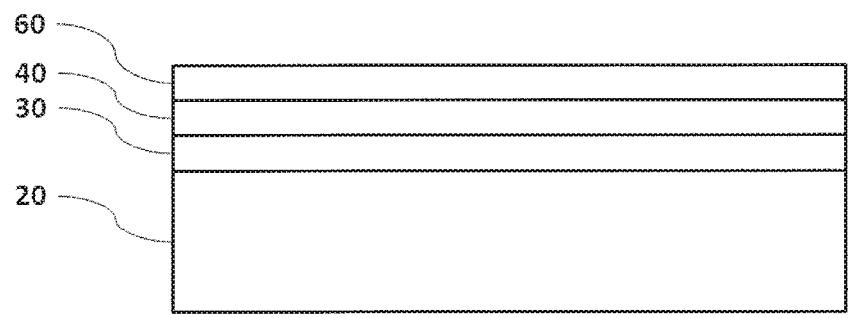
Figure 3D:
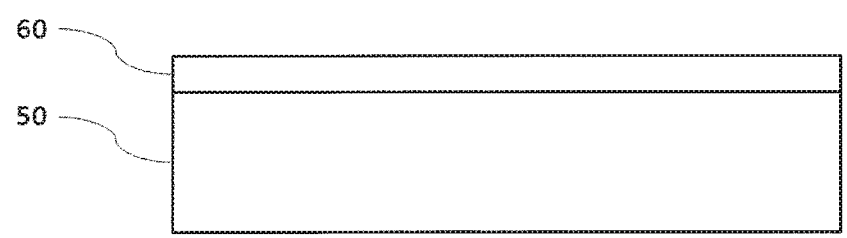

The additional layer 60 may be placed between the carrier substrate 20 and the intermediate layer 30 (FIG. 3a), between the intermediate layer 30 and the useful layer 40 (FIG. 3b), on the free surface of the useful layer 40 (FIG. 3c), or even on the receiver substrate 50 (FIG. 3d).

The chemical species contained in the additional layer 60 may comprise at least one of the elements of the following group: hydrogen, nitrogen, helium, argon and oxygen.

The additional layer 60 may comprise silicon dioxide ($SiO_2$) containing hydrogen in the form of OH or H ions or molecules of water $H_2O$, but also carbon-containing sub-products such as $CH_3OH$ or $CH_3CH_2OH$.

The additional layer 60 may be formed by plasma-enhanced chemical vapor deposition (PECVD). The precursor used in the formation of the additional layer 60 may comprise silane ($SiH_4$) diluted in a flow of nitrous oxide ($N_2O$) or oxygen ($O_2$). The additional layer 60 may be deposited at a temperature in a range extending from 200° C. to 500° C., such as 300° C., for example.

The additional layer 60 may be produced during fabrication of the donor substrate 10, when the additional layer 60 is disposed either between the carrier substrate 20 and the intermediate layer 30 or between the intermediate layer 30 and the useful layer 40.

The additional layer 60 may also be formed on the free surface of the useful layer 40.

Figure 2C:
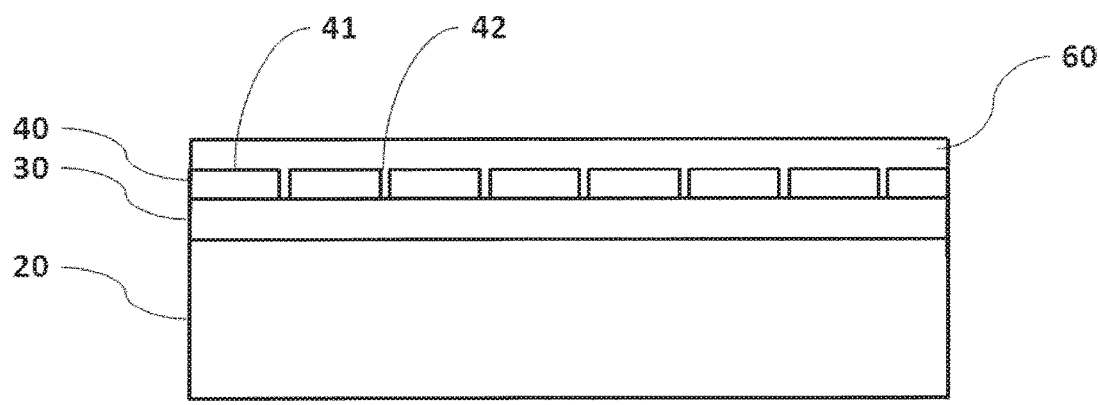

Such as shown in FIG. 2c, when trenches 42 are formed passing partially or entirely through the thickness of the useful layer 40, the additional layer 60 may also fill the trenches 42.

Figure 4:
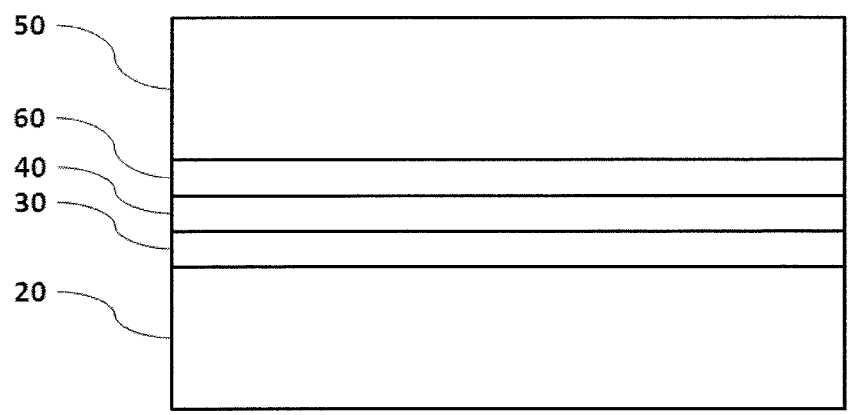
FIG. 4 is a schematic view of the assembling step, according to one embodiment of the present disclosure.

Referring to FIG. 4, a step c) of a transferring process of the present disclosure may include assembling the donor substrate 10 and the receiver substrate 50.

The assembly is carried out so that the useful layer 40, the intermediate layer 30 and the additional layer 60 are disposed between the carrier substrate 20 and the receiver substrate 50.

Step c) may comprise a direct bonding step.

Figure 5:
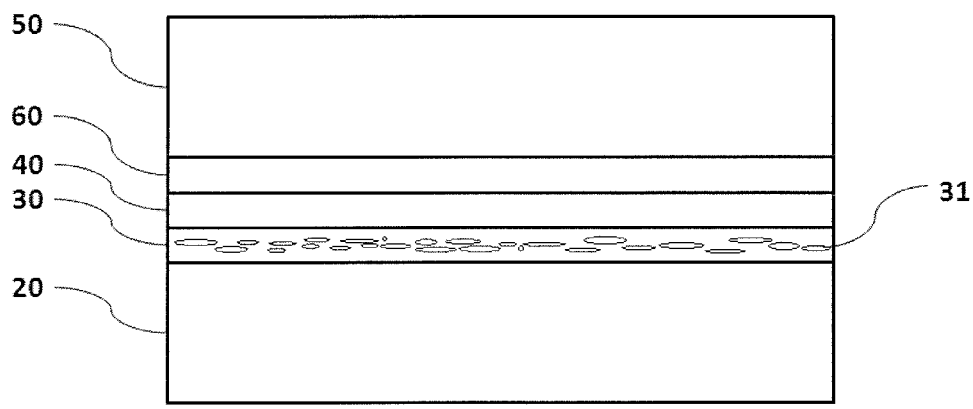
FIG. 5 is a schematic view of the heat treatment step d), according to one embodiment of the present disclosure.

A step d) of the present disclosure may comprise a heat treatment carried out on the assembled donor substrate 10 and receiver substrate 50 at a second temperature above the first temperature (or glass transition temperature of the intermediate layer 30). The intermediate layer 30 softens in step d). Moreover, the chemical species contained in the additional layer 60 may diffuse from the additional layer 60 toward and into the intermediate layer 30 according to Fick's laws of diffusion. Since the intermediate layer 30 is soft, micro-bubbles or micro-cavities may then be formed in the intermediate layer 30. The micro-bubbles and/or micro-cavities weaken the intermediate layer 30, and thus form a weak zone 31, which may extend over the entire extent of the intermediate layer 30 (FIG. 5).

When the additional layer 60 is formed on the free surface of the useful layer 40, the chemical species contained in the additional layer 60 diffuse first through the useful layer 40 and then into the intermediate layer 30.

When the trenches 42 are formed passing partially or entirely through the thickness of the useful layer 40, the chemical species contained in the additional layer 60 may also pass through the trenches 42 to reach the intermediate layer 30 (FIG. 2c).

The heat treatment may be carried out at a temperature in a range extending from 700° C. to 1100° C., such as at 800° C., for example.

The presence of the receiver substrate 50 stiffens the structure in step d) of forming the weak zone 31.

A process according to the present disclosure may also include an additional step e) comprising the fracture of the intermediate layer 30 along the weak zone 31 so as to transfer the useful layer 40 to the receiver substrate 50. The fracture may be achieved by applying a force to the assembly, for example, by inserting a blade at the assembly interface.

Thus, according to the present disclosure, it is possible to form a weak zone 31 in an intermediate layer 30 by injecting chemical species initially contained in an additional layer 60 into the intermediate layer 30. The formation of the weak zone 31 in the intermediate layer 30, according to the present disclosure, may prevent or reduce degradation of the useful layer 40 intended to be transferred to the receiver substrate 50.

The present disclosure is particularly advantageous when it is a question of transferring a useful layer 40, having a polarity, from a first substrate to a second substrate.

While the present invention has been described herein with respect to certain preferred embodiments, those of ordinary skill in the art will recognize and appreciate that it is not so limited. Rather, many additions, deletions and modifications to the preferred embodiments may be made without departing from the scope of the invention as hereinafter claimed. In addition, features from one embodiment may be combined with features of another embodiment while still being encompassed within the scope of the invention as contemplated by the inventors.

What is claimed is:

1. A method for transferring a useful layer to a receiver substrate, the process comprising:
providing a donor substrate comprising an intermediate layer located between a carrier substrate and a useful layer, the intermediate layer configured to be plastically deformed when heated to a temperature at or above a first temperature, wherein the intermediate layer does not include chemical species susceptible to degassing during a heat treatment carried out at or above the first temperature;

providing a receiver substrate;

assembling the receiver substrate and the donor substrate such that the useful layer and the intermediate layer are disposed between the carrier substrate and the receiver substrate;

providing an additional layer disposed between the carrier substrate and the receiver substrate; the additional layer comprising chemical species susceptible to diffusion out from the additional layer and into the intermediate layer during the heat treatment carried out at or above the first temperature so as to form a weak zone in the intermediate layer;

carrying out the heat treatment on the receiver substrate and the donor substrate after assembling the receiver substrate and the donor substrate, the heat treatment being carried out at a second temperature above the first temperature.

2. The method of claim 1, further comprising fracturing the weak zone after carrying out the heat treatment and transferring the useful layer from the carrier substrate to the receiver substrate.

3. The method of claim 2, further comprising disposing the additional layer between the intermediate layer and the carrier substrate.

4. The method of claim 2, further comprising providing the additional layer on a free surface of the useful layer prior to assembling the receiver substrate and the donor substrate.

5. The method of claim 2, further comprising forming the additional layer on the receiver substrate prior to assembling the receiver substrate and the donor substrate.

6. The method of claim 1, wherein the useful layer comprises a plurality of regions separated by trenches extending entirely through a thickness of the useful layer.

7. The method of claim 1, wherein the intermediate layer comprises a glass.

8. The method of claim 7, wherein the glass comprises at least one material selected from the group consisting of phosphosilicate glass and borophosilicate glass.

9. The method of claim 1, wherein the chemical species susceptible to diffusion in the additional layer comprise at least one element selected from the group consisting of hydrogen, nitrogen, helium and argon.

10. The method of claim 1, wherein the additional layer comprises silicon dioxide containing hydrogen.

11. The method of claim 1, wherein the carrier substrate comprises at least one material selected from the group consisting of silicon, germanium, silicon carbide and sapphire.

12. The method of claim 11, wherein the useful layer comprises at least one material selected from the group consisting of GaN and $In_xGa_{1-x}N$.

13. The method of claim 1, wherein the receiver substrate comprises at least one material selected from the group consisting of silicon, germanium, silicon carbide and sapphire.

14. The method of claim 1, further comprising disposing the additional layer between the intermediate layer and the carrier substrate.

15. The method of claim 1, further comprising providing the additional layer on a free surface of the useful layer prior to assembling the receiver substrate and the donor substrate.

16. The method of claim 1, further comprising forming the additional layer on the receiver substrate prior to assembling the receiver substrate and the donor substrate.

17. The method of claim 1, wherein the useful layer comprises at least one material selected from the group consisting of GaN and $In_xGa_{1-x}N$.

\* \* \* \* \*